United States Patent
Kawashima et al.

(10) Patent No.: US 8,610,102 B2
(45) Date of Patent: Dec. 17, 2013

(54) NONVOLATILE MEMORY DEVICE AND MANUFACTURING METHOD THEREOF

(75) Inventors: Yoshio Kawashima, Osaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/378,570

(22) PCT Filed: Jun. 16, 2010

(86) PCT No.: PCT/JP2010/004002
§ 371 (c)(1),
(2), (4) Date: Dec. 15, 2011

(87) PCT Pub. No.: WO2010/146850
PCT Pub. Date: Dec. 23, 2010

(65) Prior Publication Data
US 2012/0091425 A1 Apr. 19, 2012

(30) Foreign Application Priority Data
Jun. 18, 2009 (JP) .................................. 2009-145237

(51) Int. Cl.
*H01L 47/00* (2006.01)
*H01L 29/06* (2006.01)
*H01L 21/00* (2006.01)
*H01L 21/20* (2006.01)
*G11C 11/00* (2006.01)

(52) U.S. Cl.
USPC .................. 257/4; 257/5; 438/104; 438/382; 365/148

(58) Field of Classification Search
USPC ........... 257/4, 5, E21.003, E21.006, E21.017, 257/E21.023, E21.661; 438/104, 382; 365/148
See application file for complete search history.

(56) References Cited

U.S. PATENT DOCUMENTS

| | | | |
|---|---|---|---|
| 2002/0006674 A1* | 1/2002 | Ma et al. | 438/3 |
| 2003/0104704 A1 | 6/2003 | Lee et al. | |
| 2006/0215445 A1 | 9/2006 | Baek et al. | |
| 2006/0286687 A1* | 12/2006 | Takahashi | 438/3 |
| 2007/0194361 A1* | 8/2007 | Kokubun | 257/295 |
| 2009/0016094 A1* | 1/2009 | Rinerson et al. | 365/148 |
| 2009/0137112 A1 | 5/2009 | Tabata et al. | |
| 2009/0224224 A1 | 9/2009 | Fujii et al. | |
| 2009/0283736 A1* | 11/2009 | Kanzawa et al. | 257/2 |
| 2010/0044666 A1 | 2/2010 | Baek et al. | |
| 2011/0204314 A1 | 8/2011 | Baek et al. | |

OTHER PUBLICATIONS

International Search Report issued in International Patent Application No. PCT/JP2010/004002 dated Sep. 14, 2010.

* cited by examiner

*Primary Examiner* — Steven Loke
*Assistant Examiner* — Junaiden Mirsalahuddin
(74) *Attorney, Agent, or Firm* — McDermott Will & Emery LLP

(57) ABSTRACT

A nonvolatile memory device (10A) comprises an upper electrode layer (2); a lower electrode layer (4); a resistance variable layer (3) sandwiched between the upper electrode layer (2) and the lower electrode layer (4); and a charge diffusion prevention mask (1A) formed on a portion of the upper electrode layer (2); wherein the resistance variable layer (3) includes a first film comprising oxygen-deficient transition metal oxide and a second film comprising oxygen-deficient transition metal oxide which is higher in oxygen content than the first film; at least one of the upper electrode layer (2) and the lower electrode layer (4) comprises a simple substance or alloy of a platinum group element; and the charge diffusion prevention mask (1A) is insulative, and is lower in etching rate of dry etching than the upper electrode layer (2) and the lower electrode layer (4).

17 Claims, 14 Drawing Sheets

NONVOLATILE MEMORY DEVICE AND MANUFACTURING METHOD THEREOF

RELATED APPLICATIONS

This application is the U.S. National Phase under 35 U.S.C. §371 of International Application No. PCT/JP2010/004002, filed on Jun. 16, 2010, which in turn claims the benefit of Japanese Application No. 2009-145237, filed on Jun. 18, 2009, the disclosures of which Applications are incorporated by reference herein.

TECHNICAL FIELD

The present invention relates to a resistance variable nonvolatile memory device and a manufacturing method thereof.

BACKGROUND ART

In recent years, there has been proposed a resistance variable nonvolatile memory device using a resistance variable material comprising transition metal oxide which is less in oxygen number (hereinafter referred to as oxygen-deficient) than transition metal oxide having a stoichiometric composition. The nonvolatile memory device includes an upper electrode layer, a lower electrode layer, and a resistance variable layer sandwiched between the upper electrode layer and the lower electrode layer, and resistance values of the resistance variable layer change reversibly by applying electric pulses between an upper electrode and a lower electrode. Therefore, by associating information with the resistance values, the information can be stored in a non-volatile manner (e.g., Patent Literatures 1, 2, and 3). It is expected that the resistance variable nonvolatile memory device can achieve miniaturization, a higher speed, and lower electric power consumption in contrast to a flash memory using a floating gate.

CITATION LISTS

Patent Literature

Patent Literature 1: Japanese Laid-Open Patent Application Publication No. 2006-279042
Patent Literature 2: WO 2008/059701 A1 International Publication
Patent Literature 3: WO 2008/149484 A1 International Publication

SUMMARY OF THE INVENTION

Technical Problem

However, in the above stated resistance variable nonvolatile memory device, there is a variation in initial resistance values, even though there exists no problem associated with layer constituents such as a resistance variable layer or an electrode, a resist dimension or shape after lithography, or shapes of the respective layers after dry etching.

The present invention has been made to solve the above mentioned problem, and an object of the present invention is to provide a resistance variable nonvolatile memory device which can suppress a variation in initial resistance values.

Solution to Problem

To solve the above mentioned problem, the inventors studied intensively, and as a result, discovered a cause of a variation in the initial resistance values. Hereinafter, for the sake of convenience, films which will finally become an electrode layer, a resistance variable layer, a mask, etc., will be sometimes referred to as their "original films."

For example, in the nonvolatile memory device of Patent Literature 1, iridium (Ir) is used as the material for the upper electrode or the lower electrode (hereinafter sometimes referred to as the electrode collectively). In the nonvolatile memory device of Patent Literature 2 and the nonvolatile memory device of Patent Literature 3, platinum (Pt) is used as the electrode material. The electrode comprising iridium or platinum is typically formed by dry etching an iridium thin film or a platinum thin film using a hard mask (e.g., mask comprising TiAlN) as a mask. This is because a resist mask comprising a light-sensitive film has a low selectivity with respect to the iridium thin film or the platinum thin film in dry etching, whereas the hard mask has a high selectivity with respect to the iridium thin film or the platinum thin film in dry etching. However, the hard mask is typically electrically conductive.

By comparison, in the above stated conventional nonvolatile memory devices, since oxygen in oxygen-deficient transition metal oxide constituting the resistance variable layer allows the resistance variable layer to change its resistance, it is necessary to control an oxygen concentration in the resistance variable layer. For example, in the nonvolatile memory device of Patent Literature 2, since a resistance changing operation at one electrode side is enabled because of the presence of a higher-oxygen-concentration layer in the resistance variable layer at one electrode side, the higher-oxygen-concentration layer must be formed surely in the middle of manufacturing steps. In particular, in the nonvolatile memory device of Patent Literature 3, the resistance variable layer includes two layers which are different in oxygen content and are stacked together, and a resistance changing operation at one electrode side is enabled because of the presence of a higher-oxygen-content layer at one electrode side. Therefore, the two layers which are different in oxygen content must be stacked together surely in the middle of manufacturing steps.

However, in the above conventional nonvolatile memory devices, the resistance variable layer is formed between the upper electrode layer and the lower electrode layer. Because of this, in the step of forming the upper electrode layer, the resistance variable layer and the lower electrode layer, by dry etching their original films sequentially, during etching of the original film of the resistance variable layer and the original film of the lower electrode layer, etching plasma charge having diffused from the upper electrode layer patterned to have a specified shape by completing etching of the original film of the upper electrode layer flows toward the original film of the lower electrode layer through the resistance variable layer (or its original layer) (this process will be described in detail in conjunction with comparative example in the present embodiment). It is presumed that, because of the charge, oxygen or holes in the resistance variable layer migrate and hence an oxygen concentration profile is disordered, thereby resulting in a variation in initial resistance values. This is a cause of a variation in initial resistance values, in the above conventional resistance variable nonvolatile memory devices. In particular, in the nonvolatile memory device of Patent Literature 3, if the oxygen or holes in the resistance variable layer migrate, a layer-stacked structure of two layers which are in different in oxygen content would fall apart, and as a result, such a problem arises noticeably.

It should be noted that such a problem does not arise in a nonvolatile memory device using ferroelectric as a memory material. This may be due to the fact that ferroelectric is an insulator, and hence etching plasma charge does not flow through the ferroelectric.

The present invention has been made in view of the above findings.

A method of manufacturing a nonvolatile memory device of the present invention including an upper electrode layer, a lower electrode layer and a resistance variable layer sandwiched between the upper electrode layer and the lower electrode layer, comprises depositing a lower electrode film on a substrate; depositing a resistance variable film on the lower electrode film; depositing an upper electrode film on the resistance variable film; depositing a charge diffusion prevention mask film on the upper electrode film; patterning the charge diffusion prevention mask film in a predetermined shape to form a charge diffusion prevention mask comprising the charge diffusion prevention mask film; and dry etching the upper electrode film, the resistance variable film, and the lower electrode film, using the charge diffusion prevention mask as a mask, to form the upper electrode layer, the lower electrode layer and the resistance variable layer; wherein the resistance variable film includes a first film comprising oxygen-deficient transition metal oxide and a second film comprising oxygen-deficient transition metal oxide which is higher in oxygen content than the first film such that the first film and the second film are stacked together; at least one of the upper electrode film and the lower electrode film comprises a simple substance or alloy of a platinum group element; and the charge diffusion prevention mask film is insulative, and is lower in etching rate of dry etching than the upper electrode film and the lower electrode film. Note that the wording "film" and wording "layer" are used for the sake of convenience, and there is no essential difference between them. Either one of "film" and "layer" may be used, or they may be used in a reverse manner, so long as the element of the nonvolatile memory device is distinguished from an original processed into this element finally.

In accordance with this manufacturing method, when dry etching of the upper electrode film, the resistance variable film, and the lower electrode film is performed, particularly when dry etching of the resistance variable film and the lower electrode film is performed, the insulative charge diffusion prevention layer in the insulative charge diffusion prevention mask formed as a mask on the upper electrode layer can suppress etching plasma charge. Thus, it is possible to prevent the etching plasma charge from diffusing from the upper electrode layer to the resistance variable layer. As a result, it is possible to manufacture a nonvolatile memory device in which a profile of an oxygen concentration within the resistance variable layer is not disordered, and a variation in initial resistance values is lessened.

The charge diffusion prevention mask film may include an inorganic insulating film comprising an inorganic insulating material, and a conductive metal film formed on the inorganic insulating film and comprising a metal; and depositing the charge diffusion prevention mask film includes depositing the inorganic insulating film on the upper electrode film, and depositing the conductive metal film on the inorganic insulating film.

The inorganic insulating material of the inorganic insulating film may comprise one material selected from $Ta_2O_5$, SiN, and SiON, or a combination of two or more materials selected from $Ta_2O_5$, SiN, and SiON. $TaO_x$ which is oxygen-deficient in composition with respect to $Ta_2O_5$ may be used as the material of the resistance variable layer. SiN and SiON may be used as the material of the interlayer insulating layer of the nonvolatile memory device. Therefore, in such a configuration, the nonvolatile memory device can be manufactured using a material commonly used in manufacturing process steps of the nonvolatile memory device, without using a material exclusive for the charge diffusion prevention mask film.

The charge diffusion prevention mask film may be insulative, and may include a single film which is lower in etching rate of dry etching than the upper electrode film and the lower electrode film; and depositing the charge diffusion prevention mask film may be depositing the single film on the upper electrode film. As used herein, the "single film" means "one film."

Preferably, the single film comprises $Ta_2O_5$. The film comprising $Ta_2O_5$ is insulative, and can be made much lower in etching rate of dry etching than the film comprising the simple substance or alloy of the platinum group element. Therefore, in such a configuration, it is possible to suitably implement a single film "which is insulative, and is lower in etching rate of dry etching than the upper electrode film and the lower electrode film."

The platinum group element is preferably platinum, iridium, or palladium.

The charge diffusion prevention mask film and the resistance variable film may comprise an identical element. In accordance with this manufacturing method, the same etching condition can be used for etching of the charge diffusion prevention mask film and for etching of the resistance variable film, which makes it easy to perform etching. Further, since the charge diffusion prevention film and the resistance variable film can be deposited using the same apparatus, the nonvolatile memory device can be manufactured at a lower cost than the conventional nonvolatile memory device.

The method of manufacturing the nonvolatile memory device may comprise: after forming the upper electrode layer, the lower electrode layer and the resistance variable layer, removing a layer comprising the conductive metal film from the charge diffusion prevention mask film; and forming an interlayer insulating layer over the substrate such that the interlayer insulating layer covers a charge diffusion prevention layer from which the layer comprising the conductive metal film has been removed, the upper electrode layer, the lower electrode layer and the resistance variable layer.

The method of manufacturing the nonvolatile memory device may comprise after forming the upper electrode layer, the lower electrode layer and the resistance variable layer, forming an interlayer insulating layer over the substrate such that the interlayer insulating layer covers the charge diffusion prevention layer comprising the single film, the upper electrode layer, the lower electrode layer and the resistance variable layer.

A nonvolatile memory device of the present invention comprises an upper electrode layer; a lower electrode layer; a resistance variable layer sandwiched between the upper electrode layer and the lower electrode layer; and a charge diffusion prevention mask formed on a portion of the upper electrode layer; wherein the resistance variable layer includes a first layer comprising oxygen-deficient transition metal oxide and a second layer comprising oxygen-deficient transition metal oxide which is higher in oxygen content than the first layer such that the first layer and the second layer are stacked together; at least one of the upper electrode layer and the lower electrode layer comprises a simple substance or alloy of a platinum group element; and the charge diffusion prevention mask is insulative, and is lower in etching rate of dry etching than the upper electrode layer and the lower electrode layer. This makes it possible to attain a nonvolatile memory device which has a less variation in initial resistance values.

The charge diffusion prevention mask may preferably comprise one material selected from $Ta_2O_5$, SiN, and SiON, or a combination of two or more materials selected from $Ta_2O_5$, SiN, and SiON.

The charge diffusion prevention mask may preferably comprise $Ta_2O_5$.

The platinum group element may preferably be platinum, iridium, or palladium.

The charge diffusion prevention mask and the resistance variable layer may preferably comprise an identical element. In such a configuration, the nonvolatile memory device can be manufactured at a lower cost than the conventional nonvolatile memory device.

The above and further objects, features and advantages of the invention will more fully be apparent from the following detailed description with accompanying drawings.

Advantageous Effects of the Invention

The present invention has been configured as described above, and can achieve an advantage that a variation in initial resistance values can be suppressed in the nonvolatile memory device.

DESCRIPTION OF THE EMBODIMENTS

DESCRIPTION OF THE EMBODIMENTS

Figure 1:
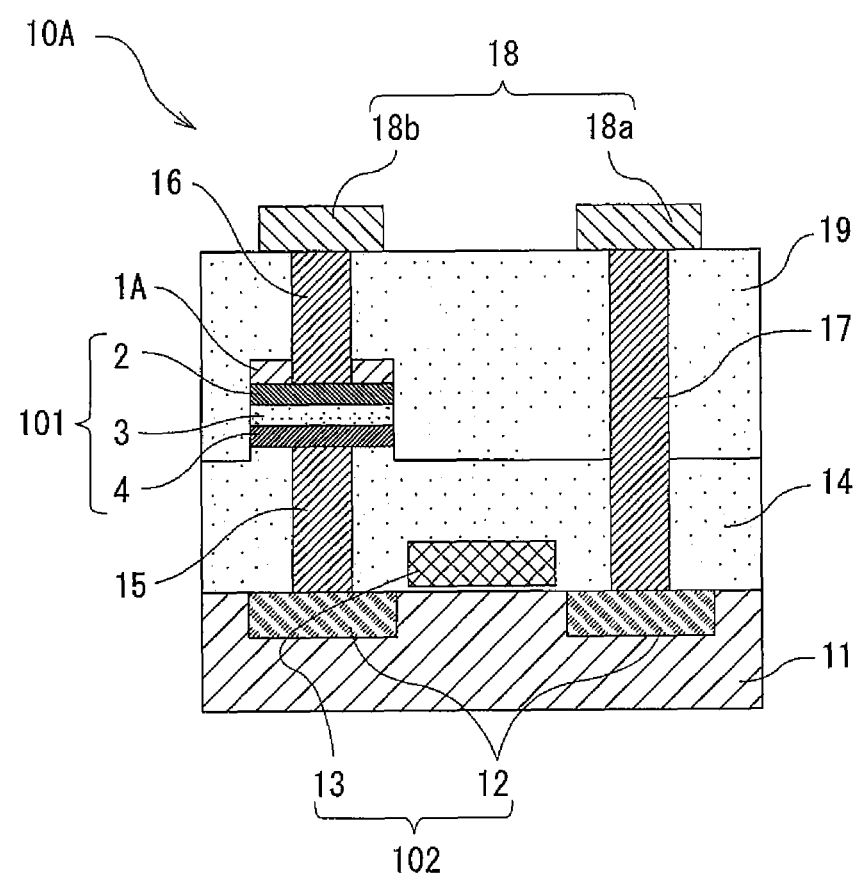
FIG. 1 is a cross-sectional view showing a configuration of a nonvolatile memory device according to Embodiment 1 of the present invention.

Hereinafter, preferred embodiments of the present invention will be described with reference to the accompanying drawings. Throughout the drawings, the same or corresponding constituents are designated by the same reference numerals, and repetitive description will be omitted.

Embodiment 1

[Configuration]
<Overall Configuration>
FIG. 1 is a cross-sectional view showing a configuration of a nonvolatile memory device according to Embodiment 1 of the present invention.

As shown in FIG. 1, a nonvolatile memory device 10A of Embodiment 1 includes a nonvolatile memory element 101. Hereinafter, although a description will be given of an example in which the nonvolatile memory device 10A includes the nonvolatile memory element 101 and a thin-film transistor 102 electrically connected to the nonvolatile memory element 101 (nonvolatile memory device of one transistor/one nonvolatile memory element (active matrix type)) will be described, the nonvolatile memory device 10A of the present embodiment need not include the thin-film transistor 102. Although the nonvolatile memory device 10A of Embodiment 1 includes a single nonvolatile memory element 101, it may include a plurality of nonvolatile memory elements 101 as a matter of course.

The nonvolatile memory device 10A includes a substrate 11. The substrate 11 is constituted by, for example, a silicon substrate. In the substrate 11, a pair of source/drain layers 12 are formed to be spaced apart from each other within a well (boundary is not depicted). A gate layer 13 is formed above a region (channel region) between the pair of source/drain layers 12. A gate insulating layer (not shown) is formed between the channel region and the gate layer 13. The pair of source/drain layers 12 and the gate layer 13 constitute a thin-film transistor.

A first interlayer insulating layer 14 is formed to cover the surface of the substrate 11 provided with the pair of source/drain layers 12 and the gate layer 13. The first interlayer insulating layer 14 comprises, for example, $SiO_2$.

The nonvolatile memory element 101 is formed on the first interlayer insulating layer 14. To be specific, a lower electrode layer 4 is formed on the first interlayer insulating layer 14, a resistance variable layer 3 is formed on the lower electrode layer 4, and an upper electrode layer 2 is formed on the resistance variable layer 3. That is, the resistance variable layer 3 is sandwiched between the upper electrode layer 2 and the lower electrode layer 4. The upper electrode layer 2, the resistance variable layer 3 and the lower electrode layer 4 constitute the nonvolatile memory element 101. In addition, a charge diffusion prevention mask 1A is formed on the upper electrode layer 2.

A second interlayer insulating layer 19 is formed to cover the nonvolatile memory element 101, the charge diffusion prevention mask 1A, and the first interlayer insulating layer 14. The second interlayer insulating layer 19 comprises, for example, $SiO_2$.

A wire group 18 is formed on the second interlayer insulating layer 19. As shown in FIG. 1, among a plurality of wires making up the wire group 18, two wires 18a and 18b are depicted. A first contact 16 extends from the wire 18b, penetrates the second interlayer insulating layer 19 and the charge diffusion prevention mask 1A, and reaches the upper electrode layer 2 of the nonvolatile memory element 101. This allows the upper electrode layer 2 of the nonvolatile memory element 101 and the wire 18b to be electrically connected together. A second contact 15 extends from the lower electrode 4 of the nonvolatile memory element 101, penetrates the first interlayer insulating layer 14, and reaches one of the source/drain layers 12 of the thin-film transistor 102. This allows the lower electrode 4 of the nonvolatile memory element 101 and one of the source/drain layers 12 of the thin-film transistor 102 to be electrically connected together.

Moreover, a third contact 17 extends from the wire 18a, penetrates the second interlayer insulating layer 19 and the first interlayer insulating layer 14, and reaches the other of the source/drain layers 12 of the thin-film transistor 102. This allows the other of the source/drain layers 12 of the thin-film transistor 102 and the wire 18a to be electrically connected together.

Predetermined electric pulses (voltage pulses or current pulses, or both of them) are applied between the wire 18a and the wire 18b by a voltage application device (not shown). The gate layer 13 is connected to a wire (not shown). A predetermined control voltage is applied to the gate layer 13 via the wire, thereby controlling the operation of the thin-film transistor 102.

<Material of Resistance Variable Layer 3>

A material of the resistance variable layer 3 is a material of a resistance variable film 3' (original film of the resistance variable layer 3) in a manufacturing method of the nonvolatile memory device as described later.

The resistance variable layer 3 comprises a material (hereinafter referred to as an oxygen-content changeable resistance variable material) whose resistance values change due to a change in an oxygen content. The oxygen-content changeable resistance variable material allows the resistance variable layer 3 to change its resistance by application of electric pulses between the upper electrode layer 2 and the lower electrode layer 4. The reason why the material of the resistance variable layer 3 is limited to the oxygen-content changeable resistance variable material is that, by optimizing the oxygen content of the material and its profile, the nonvolatile memory element 101 can achieve a high-speed operation with a pulse width of 100 ns or less, and a resistance changing magnitude of one-digit or more is provided, which increases a margin in reading of the resistance values.

As used herein, the phrase "the resistance variable layer 3 comprises the oxygen-content changeable resistance variable material" means that "the resistance variable layer 3 may substantially comprise the oxygen-content changeable resistance variable material and may contain a minute amount of impurities and/or additive which will not negatively affect the resistance change of the resistance variable layer 3.

As typical examples of the oxygen-content changeable resistance variable material, there are oxygen-deficient transition metal oxides. Preferable oxygen-deficient transition metal oxides are, for example, $TaO_x$, $HfO_x$, $ZrO_x$, $NiO_x$, $VO_x$, $ZnO_x$, $NbO_x$, $TiO_x$, $WO_x$, $CoO_x$, $FeO_x$ (x is the number of O), etc. The oxygen-deficient transition metal oxides are less in oxygen number than a transition metal oxide having a stoichiometric composition. The transition metal oxide having a stoichiometric composition typically exhibits a property of an insulator, while the oxygen-deficient transition metal oxide exhibits a semiconductive or conductive property.

When electric pulses with different polarities are applied between two electrodes in a configuration in which the above stated oxygen-deficient transition metal oxide is disposed between the two electrodes and is electrically connected to them (bipolar operation), the resistance values of the oxygen-deficient transition metal oxide are allowed to increase or decrease reversibly. The increased or decreased resistance values are retained after application of the electric pulses between the two electrodes stops. A resistance changing mechanism in the above case is estimated as follows.

A resistance changing phenomenon occurs by the fact that oxygen ions, by electric field, migrate and get together in a region of the resistance variable layer in the vicinity of an interface between the resistance variable layer and one of electrodes sandwiching the resistance variable layer, and these oxygen ions diffuse therefrom. To be specific, by applying a positive voltage to one of the electrodes relative to the other electrode, negatively charged oxygen ions migrate toward and get together in the region of the resistance variable layer in the vicinity of the interface between the resistance variable layer and one of the electrodes, so that a high-resistance layer is formed in this region. As a result, the resistance variable layer changes to a high-resistance state. Conversely, by applying a negative voltage to one of the electrodes relative to the other electrode, the oxygen ions present in the region of the resistance variable layer in the vicinity of the interface between the resistance variable layer and the one of the electrodes, diffuse into another region in the resistance variable layer, so that the region of the resistance variable layer in the vicinity of the interface changes to a low-resistance state. The oxygen ions present in the region of the resistance variable layer in the vicinity of the interface diffuse to another region. However, a volume of another region of the resistance variable layer is much larger than a volume of the region of the resistance variable layer in the vicinity of the interface. Therefore, the resistance value in another region in the resistance variable layer does not change significantly.

Among the oxygen-deficient transition metal oxides, the material of the resistance variable layer 3 is most preferably $TaO_x(0.8 \leq x \leq 1.9)$. $TaO_x(0.8 \leq x \leq 1.9)$ enables the nonvolatile memory device to operate at a higher speed, and makes it possible to attain a reversible and stable rewrite characteristic, etc.

Hereinafter, a description will be given of a case where the material of the resistance variable layer 3 is $TaO_x(0.8 \leq x \leq 1.9)$. A preferable composition range of $TaO_x$, a characteristic of $TaO_x$, a resistance changing mechanism of $TaO_x$, etc., are described in detail in international publication of WO2008/059701A1. Please see the publication.

The resistance variable layer 3 may include a first resistance variable layer (first layer) comprising $TaO_x(0.8 \leq x \leq 1.9)$, and a second resistance variable layer (second layer) comprising $TaO_y$ (x<y). In this case, it is necessary to position the second resistance variable layer at a predetermined electrode side as described later.

<Material of Upper Electrode Layer and Material of Lower Electrode Layer>

A material of the upper electrode layer 2 and a material of the lower electrode layer 4 are a material of an upper electrode film 2' and a material of a lower electrode film 4', respectively, (original film of upper electrode layer 2 and original film of lower electrode layer 4) in the manufacturing method of the nonvolatile memory device as described later.

At least one of the upper electrode layer 2 and the lower electrode layer 4 contains a simple substance or alloy of a platinum group element. Each of the upper electrode layer 2 and the lower electrode layer 4 may have a single-layer structure or a stacked-layer structure having a plurality of layers. The platinum group element refers to platinum (Pt), iridium (Ir), and palladium (Pd). The reason why the material of the upper electrode layer 2 and the material of the lower electrode layer 4 are limited to the platinum group element is as follows. The problem that there is a variation in the initial resistance values, which is to be solved by the present invention, is attributed to the fact that either the upper electrode layer or the lower electrode layer comprises platinum, iridium, or the like, it is dry etched using a conductive hard mask, and therefore, there is no technical meaning in providing the charge diffusion prevention mask 1A, when the upper electrode layer and the lower electrode layer comprise materials other than platinum, iridium, and palladium. Platinum, iridium, and palladium are suitable for use as electrode materials because they have higher standard electrode potentials than transition metal constituting the resistance variable layer, such as Ta, Hf, or Ni, etc, they are not oxidized easily, and promote redox of the resistance variable material. And, platinum, iridium, and palladium have similar properties in which they have high melting points, and are less susceptible to acid or alkali. A hard mask is necessary to perform dry etching of platinum, iridium, and palladium.

Preferably, at least one of the upper electrode layer 2 and the lower electrode layer 4 comprises a simple substance of one material selected from platinum, iridium, and palladium, alloy of the selected element, or alloy of a combination of two or more materials selected from platinum, iridium, and palladium. When the material of the resistance variable layer 3 is the oxygen-deficient transition metal oxide, a higher-oxygen-concentration resistance variable layer or a lower-oxygen-concentration resistance variable layer can be formed at an interface between the resistance variable layer and an electrode having a higher standard electrode potential, in response to an applied voltage, and stable operation is accomplished, by selecting materials in such a manner that one electrode (the above stated predetermined electrode) of the upper electrode layer 2 and the lower electrode layer 4 has a higher standard electrode potential than the transition metal of the oxygen-deficient transition metal oxide, and the standard electrode potential of the other electrode is lower than that of the one electrode. In particular, when the oxygen-deficient transition metal oxide is $TaO_x$, this condition is satisfied, if one of the electrodes comprises platinum, iridium, palladium, or the like, and the other electrode comprises Ta, TaN, Ti, or the like.

Hereinafter, a description will be given of a case where the upper electrode 2 comprises platinum and the lower electrode 4 comprises TaN. Of course, the upper electrode 2 may comprise TaN and the lower electrode 4 comprises platinum.

<Material of Charge Diffusion Prevention Mask>

A material of the charge diffusion prevention mask 1A is a material of a charge diffusion prevention film 1A' (original film of the charge diffusion prevention layer 1A) in the manufacturing method of the nonvolatile memory device as described later.

It is required that the material of the charge diffusion prevention mask 1A be insulative and be lower in etching rate of dry etching than the upper electrode layer 2 and the lower electrode layer 4. Also, preferably, the material of the charge diffusion prevention mask 1A has high adhesivity to the electrode layer (in the present embodiment, upper electrode layer 2) under the charge diffusion prevention mask 1A. The material of the charge diffusion prevention mask 1A is required to have such properties as a whole. Therefore, the charge diffusion prevention mask 1A may have a single-layer structure or a stacked-layer structure of a plurality of layers. In the present embodiment, a description will be given of a case where the charge diffusion prevention mask 1A has a single-layer structure. As the material of the charge diffusion prevention mask 1A having a single-layer structure, for example, there is $Ta_2O_5$. Hereinafter, a description will be given of a case where the material of the charge diffusion prevention mask 1A is $Ta_2O_5$.

In this case, the etching rate of dry etching of $Ta_2O_5$ can be made much lower than that of the film comprising a simple substance or alloy of a platinum group element. This has an advantage that the shape of the mask is reflected correctly as the shape of the upper electrode.

In this case, the charge diffusion prevention mask 1A (charge diffusion prevention mask film 1A') and the resistance variable layer 3 (resistance variable film 3') comprise the same element. As a result, the same etching condition can be used for etching of the charge diffusion prevention mask film 1A' and for etching of the resistance variable film 3', which makes etching easier. Further, the charge diffusion prevention film 1A' and the resistance variable film 3' can be deposited using the same apparatus. As a result, the nonvolatile memory device of the present invention can be manufactured at lower cost than the conventional nonvolatile memory device.

SiN, SiON, or the like may be used, because the etching rate of dry etching of SiN, SiON, or the like can be made much lower than that of the film comprising a simple substance or alloy of a platinum group element. These films are CVD films commonly used in the semiconductor process steps, and make it easy to provide a thick mask layer. In addition, these films are used as an interlayer film, and allows a contact connected to the upper electrode of the resistance variable element to be easily formed.

<Manufacturing Method>

Next, a description will be given of a manufacturing method (manufacturing method of the nonvolatile memory device of the present embodiment) configured as described above.

FIGS. 2A to 2C and FIGS. 3A and 3C are cross-sectional views showing the process steps of a manufacturing method of the nonvolatile memory device according to Embodiment 1 of the present invention. Although numerous nonvolatile memory elements 101 are commonly formed on the substrate 11, only a single nonvolatile memory element 101 is depicted for the sake of brevity of description. For easier understanding, a part of the nonvolatile memory element 101 is enlarged.

Figure 2A:
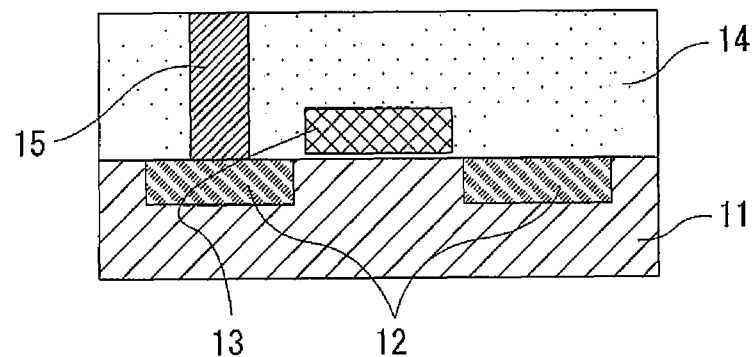
FIGS. 2A to 2C are cross-sectional views showing the process steps of a manufacturing method of the nonvolatile memory device according to Embodiment 1 of the present invention.

In the step of FIG. 2A, on the substrate 11, the pair of source/drain layers 12 and the gate layer 13 are formed. Thereafter, the first interlayer insulating layer 14 is formed over the substrate 11. Then, the first contact 15 is formed to penetrate the first interlayer insulating layer 14 and reach one of the source/drain layers 12. These process steps are carried out in conventional semiconductor process steps.

Figure 2B:
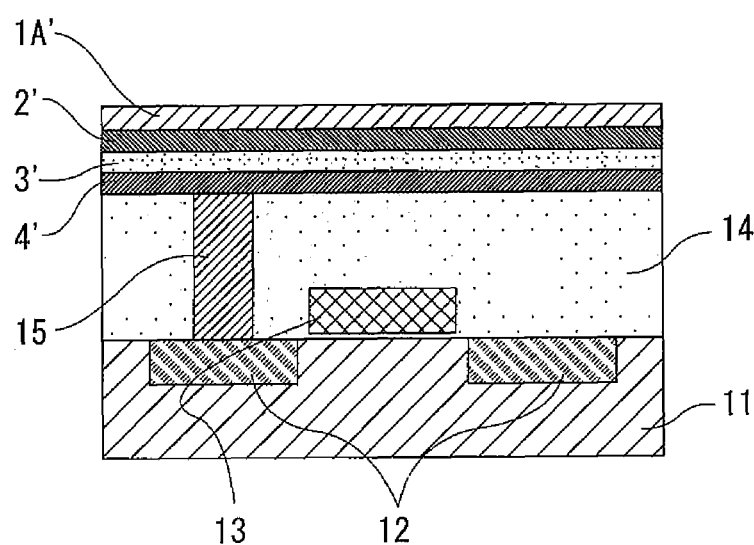

Then, in the step FIG. 2B, the lower electrode film 4', the resistance variable film 3', and the upper electrode film 2' are deposited in this order over the first interlayer insulating layer 14 to cover the first contact 15. The lower electrode film 4', the resistance variable film 3', and the upper electrode film 2' are the original film of the lower electrode layer 4, the original film of the resistance variable layer 3, and the original layer of the upper electrode layer 2, respectively. Further, the charge diffusion prevention film 1A' is deposited over the upper electrode film 2'. These process steps are carried out by, for example, sputtering. When the resistance variable layer 3 has the above double-layer structure, two layers which are different in oxygen content are deposited sequentially by changing a manufacturing condition (e.g., oxygen concentration of gas) in the middle of deposition of the resistance variable film 3'.

Figure 2C:
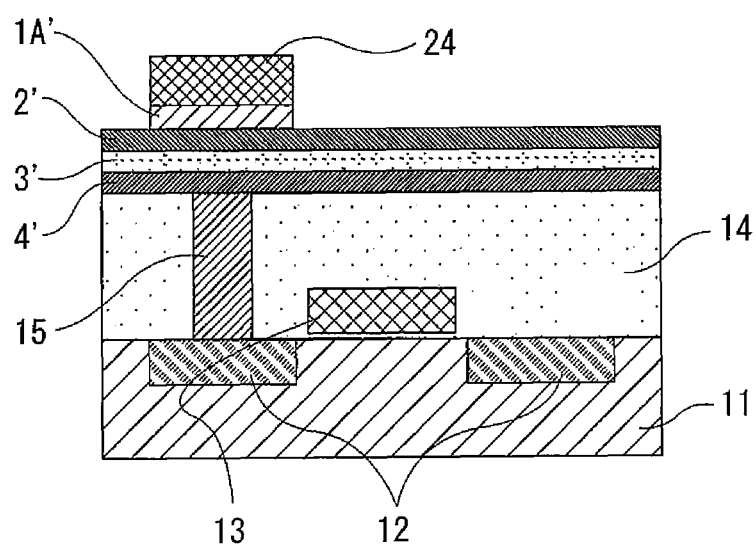

Then, in step of FIG. 2C, a resist mask 24 having a predetermined shape (pattern) is formed by normal exposure process and development process. Using the resist mask 24 as a mask, the charge diffusion prevention mask film 1A' is patterned to have predetermined shape (pattern). As a result, the charge diffusion prevention mask 1A having a predetermined shape is formed.

Figure 3A:
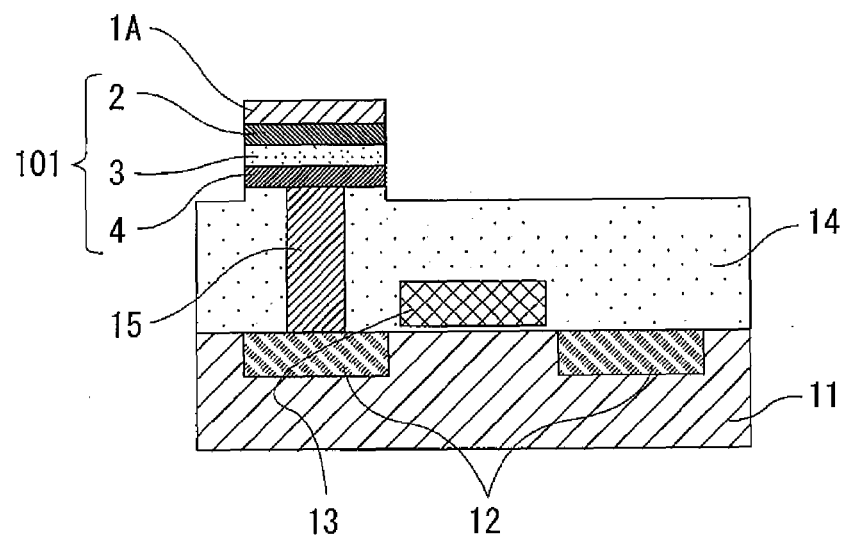
FIGS. 3A and 3B are cross-sectional views showing the process steps of the manufacturing method of the nonvolatile memory device according to Embodiment 1 of the present invention.

Then, in the step of FIG. 3A, the resist mask 24 is removed, and thereafter, the upper electrode film 2', the resistance variable film 3', and the lower electrode film 4' are formed to have predetermined shapes (patterns), respectively, by dry etching using the charge diffusion prevention mask 1A as a mask. Thus, in a state where the charge diffusion prevention mask 1A is present on the upper electrode layer 2, the nonvolatile memory element 101 including the upper electrode layer 2, the resistance variable layer 3, and the lower electrode layer 4 is formed. During this process step, charging damage to the resistance variable layer 3 due to etching plasma charge is lessened. The action and advantage will be described later.

Then, in the step of 3B, over the first interlayer insulating layer 14, the second interlayer insulating layer 19 is formed to cover the charge diffusion prevention mask 1A and the nonvolatile memory element 101. Then, the second contact 16 is formed to penetrate the second interlayer insulating layer 19 and the charge diffusion prevention mask 1A and reach the upper electrode layer 2 of the nonvolatile memory element 101, and the third contact 17 is formed to penetrate the second interlayer insulating layer 19 and the first interlayer insulating layer 14 and reach the other of the source or drain layer 12. Thereafter, on the upper surface of the second interlayer insulating layer 19, the wire group 18 including the wire 18b and the wire 18a which are connected to the second contact 16 and the third contact 17, respectively, is formed.

In the above described manner, the nonvolatile memory device 10A is manufactured.

[Action and Advantage]

Next, a description will be given of action and advantage of the manufacturing method of the nonvolatile memory device in comparison with a comparative example.

FIGS. 4A to 4D are cross-sectional views showing a flow of etching plasma in the process steps of forming the upper electrode layer, the resistance variable layer, and the lower electrode layer by dry etching, in the manufacturing method of the nonvolatile memory device according to Embodiment 1 of the present invention. FIGS. 5A to 5D are cross-sectional views showing a flow of etching plasma in the process steps of forming an upper electrode layer, a resistance variable layer, and a lower electrode layer by dry etching, in a comparative example.

Initially, the comparative example will be described. The comparative example is identical to the manufacturing method of the nonvolatile memory device of the present embodiment except that a conductive hard mask 23 is used instead of the charge diffusion prevention mask 1A. The hard mask 23 comprises an electrically conductive material such as TiAlN.

Figure 5A:
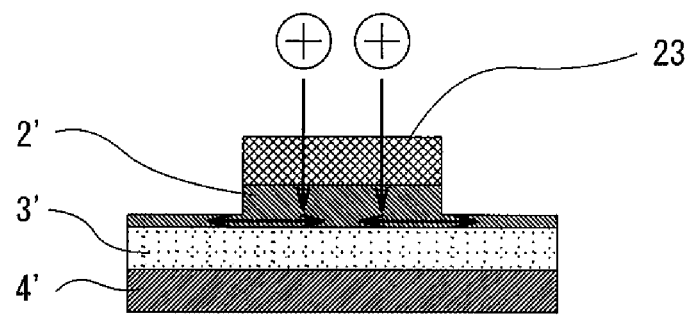
FIGS. 5A to 5D are cross-sectional views showing a flow of etching plasma in the process steps of forming an upper electrode layer, a resistance variable layer, and a lower electrode layer by dry etching, in a comparative example.

In this comparative example, as shown in FIG. 5A, during etching of the upper electrode film 2' in the step of patterning the upper electrode film 2' by dry etching using the hard mask 23, etching plasma charge diffuses to the upper electrode film 2' through the hard mask 23. The resistance variable film 3' comprises oxide, and has a higher resistance value than the upper electrode film 2' comprising the electrically conductive material, so that the charge having diffused flows through the upper electrode film 2'. Therefore, during this step, charging damage to the resistance variable film 3' due to etching plasma charge will not occur.

Figure 5B:
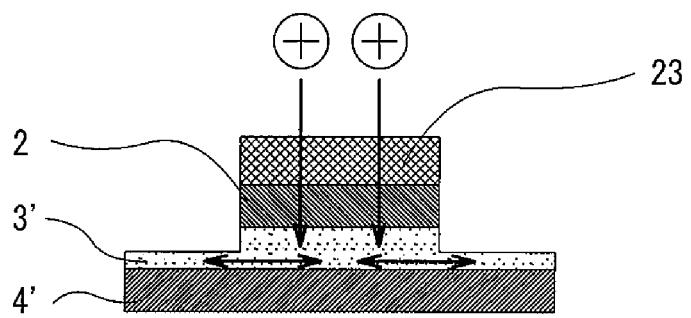

However, as shown in FIG. 5B, when the etching of the resistance variable film 3' starts after the etching of the upper electrode film 2' completes, the etching plasma charge diffuses to the upper electrode layer 2 through the conductive mask layer 23, and further diffuses to the resistance variable film 3' through the upper electrode layer 2 because the upper electrode layer 2 has been formed at that point of time. It is presumed that the etching plasma charge having diffused to the resistance variable film 3' flows through the lower electrode film 4' comprising the electrically conductive material. Therefore, charging damage to at least the resistance variable film 3' due to etching plasma charge occurs.

Figure 5C:
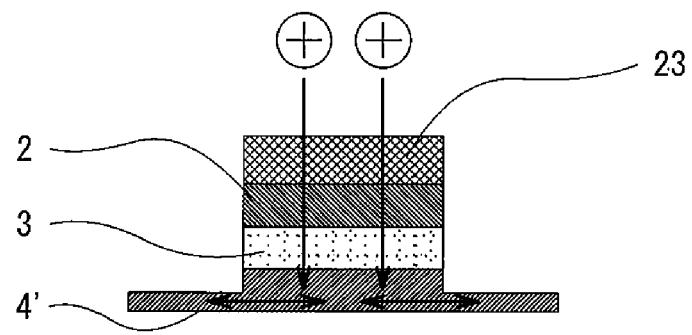

As shown in FIG. 5C, when etching of the lower electrode film 4' starts after the resistance variable layer 3 has been formed by completing the etching of the resistance variable film 3', the etching plasma charge diffuses to the lower electrode film 4' through the conductive mask layer 23, the upper electrode layer 2, and the resistance variable layer 3, and flows through the lower electrode film 4'. Since the etching plasma charge flows through the resistance variable layer 3 during this step, charging damage to the resistance variable layer 3 due to etching plasma charge occurs, at least during this step.

Figure 5D:
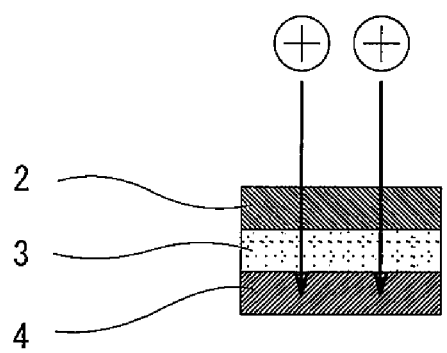

FIG. 5D shows the step of removing the hard mask 23 by etching. This step may be performed as necessary. For example, when the manufacturing method includes the step of removing the hard mask 23, the etching plasma charge diffuses to the upper electrode layer 2, the resistance variable layer 3, and the lower electrode layer 4, as in the case of the process steps before the step of removing the hard mask 23. Therefore, at least during this step, charging damage to the resistance variable layer 3 due to etching plasma charge occurs.

Next, a description will be given of the manufacturing method of the nonvolatile memory device according to the present embodiment of the present invention.

Figure 4A:
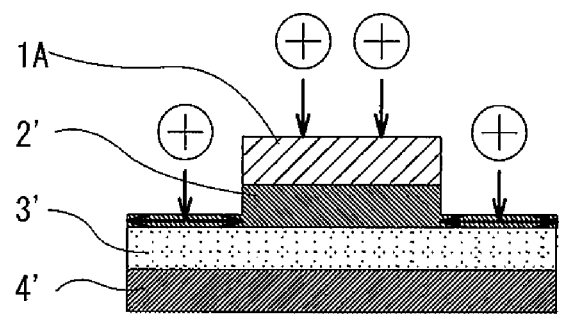
FIGS. 4A to 4D are cross-sectional views showing a flow of etching plasma in the process steps of forming an upper electrode layer, a resistance variable layer, and a lower electrode layer by dry etching, in the manufacturing method of the nonvolatile memory device according to Embodiment 1 of the present invention.

As shown in FIG. 4A, in the step of patterning the upper electrode film 2' using the charge diffusion prevention mask 1A by etching, the etching plasma charge is suppressed by the charge diffusion prevention mask 1A and is prevented from diffusing to the upper electrode film 2', in a portion of the upper electrode film 2' which is covered with the charge diffusion prevention mask 1A, because the charge diffusion prevention mask 1A has insulativity. The etching plasma charge diffusing to an etching surface of the upper electrode film 2' which is not covered with the charge diffusion prevention mask 1A, flows through the upper electrode film 2', and does not diffuse to the resistance variable layer 3. Therefore, during this step, charging damage to the resistance variable film 3' due to etching plasma charge will not occur.

Figure 4B:
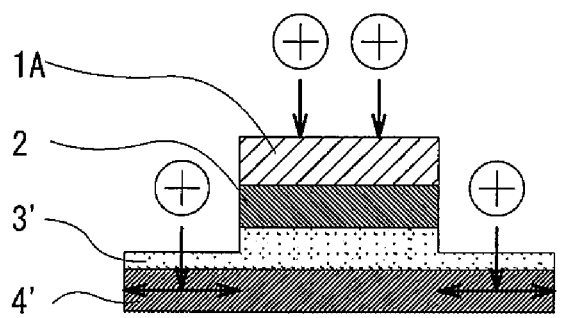

FIG. 4B shows the step of patterning the resistance variable film 3' by etching after the upper electrode layer 2 has been formed by completing the etching of the upper electrode film 2'. During this step, the etching plasma charge is suppressed by the charge diffusion prevention mask 1A and is prevented from diffusing to the upper electrode layer 2, in a portion of the resistance variable film 3', which is located under the charge diffusion prevention mask 1A, because the charge diffusion prevention mask 1A has insulativity. Because of this, the etching plasma charge does not diffuse to the resistance variable film 3' in contact with the upper electrode layer 2. The etching plasma charge directly diffuses to an etching surface of the resistance variable film 3' which is not covered with the charge diffusion prevention mask 1A, but it is presumed that the etching plasma charge having diffused flows through the lower electrode film 4', as described above. Therefore, the etching surface of the resistance variable film 3 is damaged by charging of the etching plasma charge, but the portion damaged by charging, which is the etching surface, is etched away. In this way, during this step, charging damage to the resistance variable layer 3 patterned as the nonvolatile memory element, due to the etching plasma charge, is prevented.

Figure 4C:
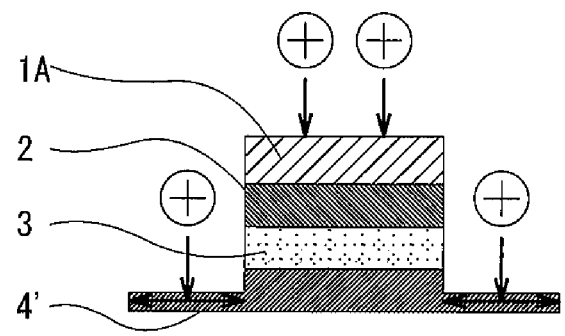

As shown in FIG. 4C, in the step of patterning the lower electrode film 4' by etching, the etching plasma charge is suppressed by the charge diffusion prevention mask 1A and is prevented from diffusing to the upper electrode layer 2 and to the resistance variable layer 3, in a portion under the charge diffusion prevention mask 1A. The etching plasma charge diffusing to an etching surface of the lower electrode film 4' which is not covered with the charge diffusion prevention mask 1A, flows through the lower electrode film 4'. In this way, during this step, charging damage to the resistance variable layer 3 due to the etching plasma charge is prevented.

Figure 4D:
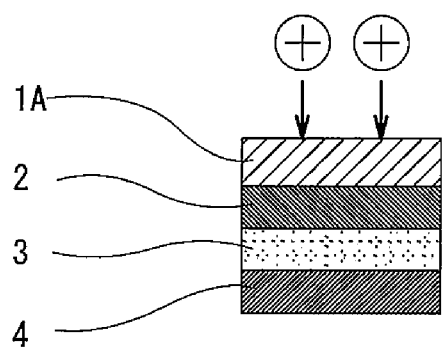

FIG. 4D shows a state where the lower electrode layer 4 has been formed by completing etching of the lower electrode film 4'. In the present embodiment, the step of forming the upper electrode layer, the resistance variable layer and the lower electrode layer by dry etching completes, in a state where the charge diffusion prevention mask 1A is left on the upper electrode layer 2 without removing the charge diffusion prevention mask 1A. Thus, since the charge diffusion prevention mask 1A is left until the end of the steps, the etching plasma charge is suppressed by the charge diffusion prevention mask 1A, and is prevented from diffusing to the upper electrode layer 2, the resistance variable layer 3 and the lower electrode layer 4. In this way, the manufacturing of the nonvolatile memory element 10 completes in a state where charging damage to the resistance variable layer 3 due to the etching plasma charge is prevented.

[Operation]

Next, a description will be given of the operation of the nonvolatile memory device of the present embodiment configured and manufactured as described above.

Referring to FIG. 1, in the nonvolatile memory element 101, a first predetermined electric pulse (current pulse and/or voltage pulse) is applied between the lower electrode layer 4 and the upper electrode layer 2. At this time, the electric pulse diffuses to the resistance variable layer 3 sandwiched between the lower electrode layer 4 and the upper electrode layer 2. As a result, the resistance variable layer 3 is caused to have a first predetermined resistance value and retains its state. Under this state, when a second predetermined electric pulse is applied between the lower electrode layer 4 and the upper electrode layer 2, the resistance variable layer 3 changes the resistance value to a second predetermined resistance value, and retains its state.

It is supposed that the first predetermined resistance value and the second predetermined resistance value correspond to, for example, two values of binary data, respectively. In this setting, by applying the first or second predetermined electric pulse to the resistance variable layer 3, the binary data can be written to the nonvolatile memory element 101. Or, by feeding, to the nonvolatile memory element 101, a voltage or current which will not change the resistance value of the resistance variable layer 3 and detecting its resistance value, the binary data written in the nonvolatile memory element 101 can be read out.

In the manner as described above, the resistance variable layer 3 disposed between the lower electrode layer 4 and the upper electrode layer 2 functions as a memory portion.

In the nonvolatile memory device 10A, the nonvolatile memory element 101 is connected to the thin-film transistor 102 (voltage or current supply switch) including the gate layer 13, and the source/drain layers 12. By applying a controlled voltage or current to the nonvolatile memory element 101 via the thin-film transistor 102, the binary data can be written to the above described nonvolatile memory element 101, or the binary data written in the nonvolatile memory element 101 can be read, as described later.

The resistance value of the resistance variable layer 3 which stores the binary data depends on an oxygen concentration distribution of the resistance variable layer 3. In contrast, in the present embodiment, in the middle of the manufacturing process steps of the nonvolatile memory device 10A, the charge diffusion prevention mask 1A is formed on the upper electrode layer 2 to suppress the etching plasma charge. This makes it possible to prevent charging damage which disorders the oxygen concentration in the resistance variable layer 3, which would be caused by the phenomenon in which the etching plasma charge diffuses to the resistance variable layer 3 through the upper electrode layer 2. As a result, the oxygen concentration in the resistance variable layer 3 can be stabilized, a lesser variation occurs in resistance values (initial resistance values), and stable binary data can be attained (stored).

As described above, in accordance with the present embodiment, the charging damage to the resistance variable layer 3 due to the etching plasma charge is suppressed in the manufacturing process steps of the nonvolatile memory device 10A, and as a result, a nonvolatile memory device which has a less variation in the initial resistance values is attainable. By using the nonvolatile memory device 10A, it is possible to manufacture, for example, a nonvolatile memory device which includes a one transistor/one nonvolatile memory element and is capable of stable operation.

Embodiment 2

Figure 6:
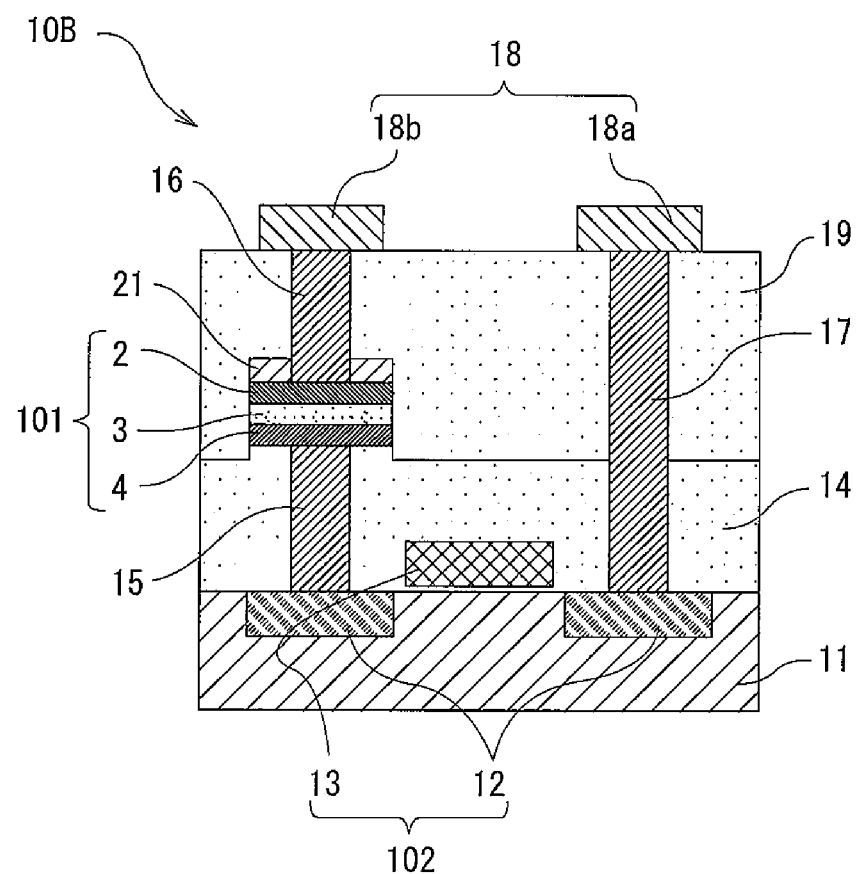
FIG. 6 is a cross-sectional view showing a configuration of a nonvolatile memory device according to Embodiment 2 of the present invention.

FIG. 6 is a cross-sectional view showing a configuration of a nonvolatile memory device according to Embodiment 2 of the present invention.

[Configuration]

As shown in FIG. 6, a nonvolatile memory device 10B of the present embodiment includes, on the upper electrode layer 2 of the nonvolatile memory element 101, an inorganic insulating mask layer 21 constituting a charge diffusion prevention mask 1B (see FIG. 7C) having a double-layer structure, instead of the charge diffusion prevention mask 1A of the nonvolatile memory device 10A of Embodiment 1. In other respects, the nonvolatile memory device 10B is identical in configuration to the nonvolatile memory device 10A of Embodiment 1.

<Manufacturing Method>

Next, a description will be given of a manufacturing method of the nonvolatile memory device (manufacturing method of the nonvolatile memory device according to Embodiment 2) configured as described above.

FIGS. 7A to 7C and FIG. 8 are cross-sectional views showing the process steps of the manufacturing method of the nonvolatile memory device according to Embodiment 2 of the present invention.

Figure 7A:
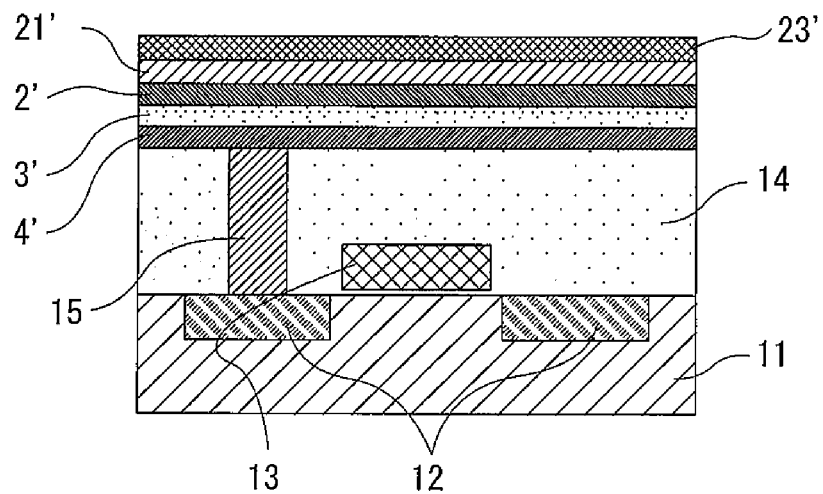
FIGS. 7A to 7C are cross-sectional views showing the process steps of a manufacturing method of a nonvolatile memory device according to Embodiment 2 of the present invention.

In the present embodiment, after the step of FIG. 2A of Embodiment 1, the step of FIG. 7A is performed.

In the step of FIG. 7A, the lower electrode film 4', the resistance variable film 3', and the upper electrode film 2' are deposited over the first insulating layer 14 in this order to cover the first contact 15. Further, an inorganic insulating mask film 21' and a conductive metal mask film 23' are deposited sequentially on the upper electrode film 2'. These process steps are performed by, for example, sputtering.

In the present embodiment, the charge diffusion prevention mask 1B has a layer-stacked structure consisting of a plurality of layers (in the present embodiment, two layers). To be specific, the charge diffusion prevention mask 1B includes an inorganic insulating mask layer 21 and a conductive metal mask layer 23 formed on the inorganic insulating mask layer 21. The inorganic insulating mask layer 21 comprises an inorganic insulating material. Preferably, the material of the inorganic insulating mask layer 21 has high adhesivity to the electrode layer (in the present embodiment, upper electrode layer 2) located under the inorganic insulating mask layer 21. To be specific, it is preferable that the material of the inorganic insulating mask layer 21 is $Ta_2O_5$, SiN or SiON. This is because $Ta_2O_5$, SiN and SiON satisfy the above condition, and are used in the manufacturing process steps of the nonvolatile memory device 10B. The material of the conductive metal mask layer 23 is metal. To be specific, as the material of the conductive metal mask layer 23, a material identical to that of a normal conductive hard mask can be used. In the present embodiment, for example, TiAlN is used.

The inorganic insulating mask film 21' and the conductive metal mask film 23' are the original film of the inorganic insulating mask layer 21 and the original film of the conductive metal mask layer 23, respectively.

Note that in the charge diffusion prevention mask 1B, the inorganic insulating mask layer 21 must be present under the conductive metal mask layer 23. Because of the layout in which the inorganic insulating mask layer 21 is present under the conductive metal mask layer 23, the inorganic insulating mask layer 21 is protected by the conductive metal mask layer 23 so that the inorganic insulating mask layer 21 is not eroded by dry etching. In addition, the etching plasma having diffused to the conductive metal mask layer 23 is suppressed from diffusing to the upper electrode layer 2 and other layers which are present under the inorganic insulating mask layer 21. If the inorganic insulating mask layer 21 is present above the conductive metal mask layer 23, the inorganic insulating mask layer 21 would be eroded by dry etching, and it would be impossible to suppress the etching plasma from diffusing to the upper electrode layer 2 and other layers which are present under the inorganic insulating mask layer 21.

Figure 7B:
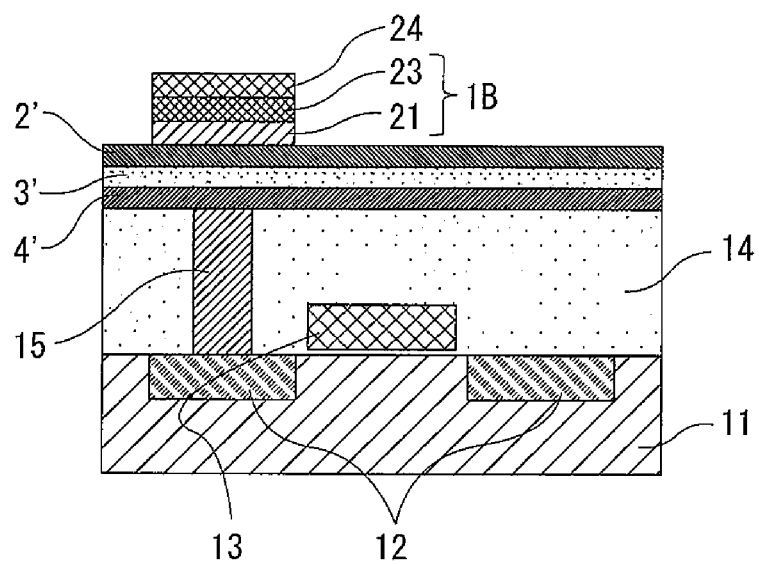

Then, as shown in the step of FIG. 7B, a resist mask 24 is formed to have a predetermined shape (pattern) by a normal exposure process and a normal develop process. Using the resist mask 24 as a mask, the conductive metal mask film 23' and the inorganic insulating mask film 21' are patterned to have a predetermined shape (pattern) by dry etching. Thereby, the charge diffusion prevention mask 1B of the predetermined shape is formed. The charge diffusion prevention mask 1B has a structure in which on the inorganic insulating mask layer 21 of the predetermined shape, the conductive metal mask layer 23 having the same shape is stacked thereon.

Figure 7C:
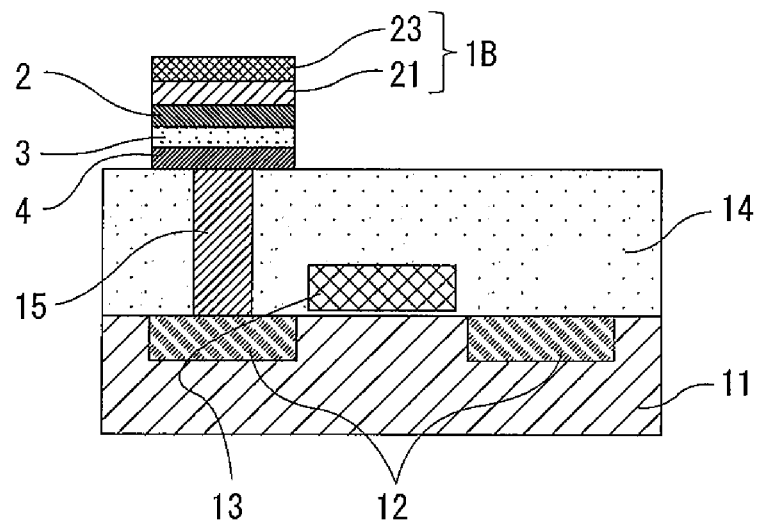

Then, in the step of FIG. 7C, the resist mask 24 is removed, and thereafter, the upper electrode film 2', the resistance variable film 3' and the lower electrode film 4' are formed to have a predetermined shape (pattern) by dry etching, using the charge diffusion prevention mask 1B as a mask. As a result, in the state where the charge diffusion prevention mask 1B is formed on the upper electrode layer 2, the nonvolatile memory element 101 including the upper electrode layer 2, the resistance variable layer 3 and the lower electrode layer 4 is formed. Since the conductive metal mask layer 23 of the charge diffusion prevention mask 1B is lower in etching rate than the upper electrode film 2', the resistance variable film 3' and the lower electrode film 4', the charge diffusion prevention mask 1B suitably functions as the mask for the dry etching. During this step, charging damage to the resistance variable layer 3 due to the etching plasma charge, can be lessened. The action and advantages will be described later.

Figure 8:
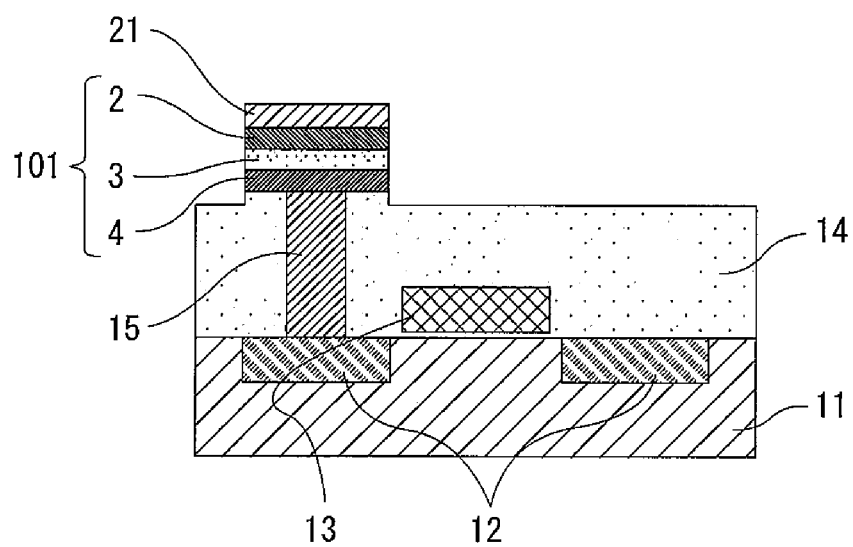
FIG. 8 is a cross-sectional view showing the process steps of the manufacturing method of a nonvolatile memory device according to Embodiment 2 of the present invention.

Then, in the step of FIG. 8, the conductive metal mask layer 23 is removed by dry etching. After that, through the step of FIG. 3B of Embodiment 1, the nonvolatile memory device 10B is manufactured.

[Action and Advantage]

Next, a description will be given of action and advantage of the nonvolatile memory device of the present embodiment.

FIGS. 9A to 9D are cross-sectional views showing a flow of etching plasma in the process steps of forming the upper electrode layer, the resistance variable layer, and the lower electrode layer by dry etching in the manufacturing method of the nonvolatile memory device according to the present embodiment.

Figure 9A:
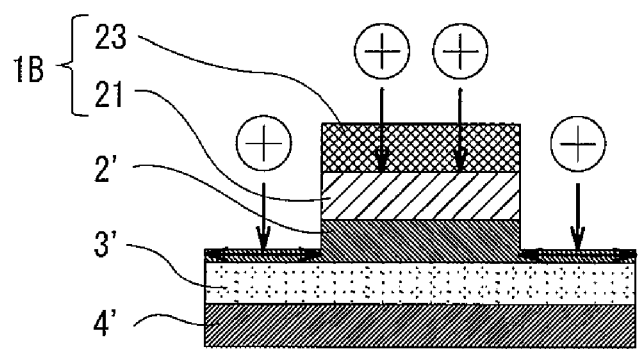
FIGS. 9A to 9D are cross-sectional views showing a flow of etching plasma in the steps of forming the upper electrode layer, the resistance variable layer, and the lower electrode layer by dry etching, in the manufacturing method of the nonvolatile memory device according to the present embodiment.

As shown in FIG. 9A, in the step of patterning the upper electrode film 2' by etching using the charge diffusion prevention mask 1B, etching plasma charge is suppressed by the inorganic insulating mask layer 21, and is prevented from diffusing to the upper electrode film 2', in a portion of the upper electrode film 2' which is covered with the charge diffusion prevention mask 1B, because the charge diffusion prevention mask 1B has the inorganic insulating mask layer 21. The etching plasma charge diffusing to an etching surface of the upper electrode film 2' which is not covered with the charge diffusion prevention mask 1B, flows through the upper electrode film 2', and does not flow to the resistance variable layer 3. Therefore, during this step, charging damage to the resistance variable film 3' due to etching plasma charge will not occur.

Figure 9B:
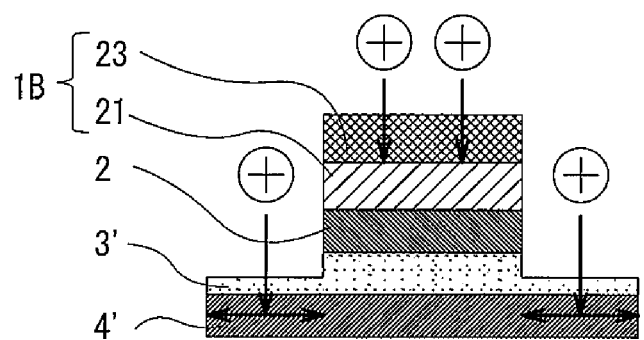

FIG. 9B shows the step of patterning the resistance variable film 3' by etching after the upper electrode layer 2 has been formed by completing the etching of the upper electrode film 2'. During this step, the etching plasma charge is suppressed by the inorganic insulating mask layer 21 and is prevented from diffusing to the upper electrode layer 2, in a portion of the resistance variable film 3', which is located under the charge diffusion prevention mask 1B, because the charge diffusion prevention mask 1B has the inorganic insulating mask layer 21. Because of this, the etching plasma charge does not diffuse to the resistance variable film 3' in contact with the upper electrode layer 2. The etching plasma charge directly diffuses to an etching surface of the resistance variable film 3' which is not covered with the charge diffusion prevention mask 1B, but it is presumed that the etching plasma charge having diffused flows through the lower electrode film 4', as described above. Therefore, the etching surface of the resistance variable layer 3 is damaged by charging of the etching plasma charge, but the portion damaged by charging, which is the etching surface, is etched away. In this way, during this step, charging damage to the resistance variable layer 3 patterned as the nonvolatile memory element, due to the etching plasma charge, is prevented.

Figure 9C:
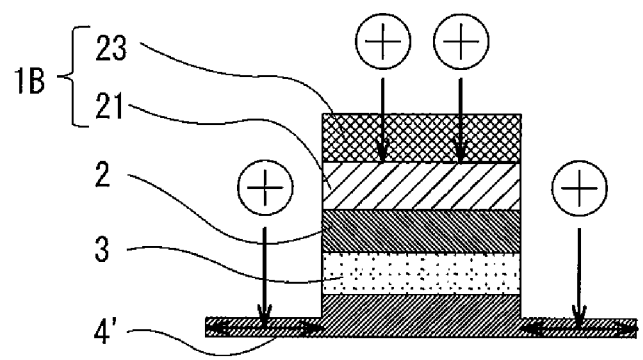

As shown in FIG. 9C, in the step of patterning the lower electrode film 4' by etching, the etching plasma charge is suppressed by the charge diffusion prevention mask 1A and is prevented from diffusing to the upper electrode layer 2 and to the resistance variable layer 3, in a portion located under the charge diffusion prevention mask 1A. The etching plasma charge diffusing to an etching surface of the lower electrode film 4' which is not covered with the charge diffusion prevention mask 1A, flows through the lower electrode film 4'. In this way, during this step, charging damage to the resistance variable layer 3 due to the etching plasma charge is prevented.

Figure 9D:
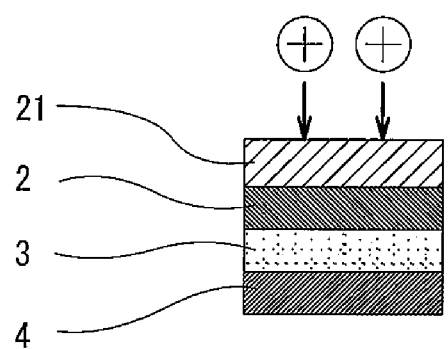

FIG. 9D shows the step of removing the conductive metal mask layer 23 by etching after the lower electrode layer 4 has been formed by completing etching of the lower electrode film 4'. During this step, as in the above steps before the step of removing the conductive metal mask layer 23, the etching plasma charge is suppressed by the inorganic insulating mask layer 21 and is prevented from diffusing to the upper electrode layer 2, the resistance variable layer 3 and the lower electrode layer 4. In this way, during this step, charging damage to the resistance variable layer 3 due to the etching plasma charge, is prevented.

As described above, in accordance with the present embodiment, as in Embodiment 1, the charging damage to the resistance variable layer 3 due to the etching plasma charge is suppressed in the manufacturing process steps of the nonvolatile memory device 10B, and as a result, a nonvolatile memory device having a less variation in the initial resistance values is attainable. By using the nonvolatile memory device 10B, it is possible to manufacture, for example, a nonvolatile memory device which includes a one transistor/one nonvolatile memory element and is capable of stable operation.

EXAMPLE

Next, an example of the present invention will be described. The present example is implementation of the manufacturing method of the nonvolatile memory device of Embodiment 2.

Initially, the step of FIG. 2A is performed. Then, in the step of FIG. 7A, TaN of 30 nm is deposited as the lower electrode film 4', $TaO_x$ ($0.8 \leq x \leq 1.9$) of 50 nm is deposited as the resistance variable film 3', platinum (Pt) of 50 nm is deposited as the upper electrode film 2', $Ta_2O_5$ of 20 nm is deposited as the inorganic insulating mask film 21', and TiAlN of 100 nm is deposited as the conductive metal mask film 23'.

In this case, after $TaO_x$ of 50 nm is deposited as the resistance variable film 3', the upper surface of $TaO_x$ may be oxidized by plasma oxidization in oxygen atmosphere, thereby forming a second film of 5 nm comprising $TaO_y$ (x<y) which is more in oxygen content than $TaO_x$, on a first film comprising $TaO_x$. In this case, the oxidization process is not limited to the plasma oxidization, but a process for oxidizing the surface effectively, for example, thermal process in oxygen atmosphere, may be performed. Alternatively, $Ta_2O_5$ of 5 nm may be deposited instead of the oxidization process, after $TaO_x$ of 45 nm is deposited.

Then, in the step of FIG. 7B, the conductive metal mask film 23' and the inorganic insulating mask film 21' are etched using the resist film 24 as a mask.

Then, in the step of FIG. 7C, after the resist film 24 is removed by ashing, the upper electrode film 2', the resistance variable film 3' and the lower electrode film 4' are etched.

Then, in the step of FIG. 8, the conductive metal mask layer 23 is etched away such that the inorganic insulating mask layer 21 is left on the upper surface of the upper electrode layer 2.

Figure 3B:
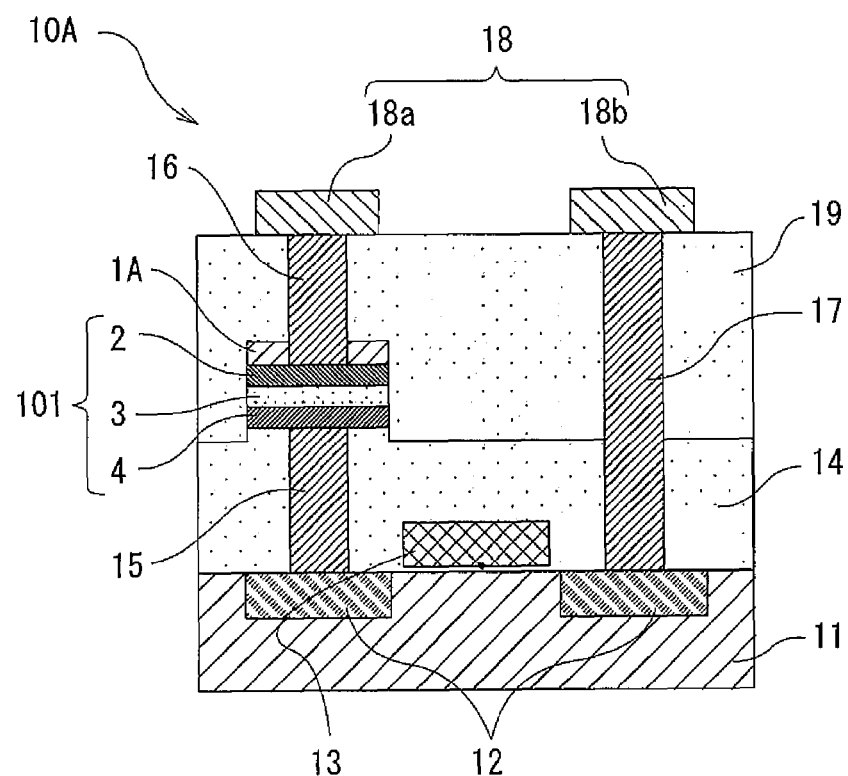

Then, in the step of FIG. 3B, the second interlayer insulating layer 19 is deposited and planarized by CMP. Then, by the semiconductor process steps used in the conventional semiconductor device, the second contact 16 is formed to penetrate the second interlayer insulating layer 19 and the inorganic insulating mask layer 21 and reach the upper electrode layer 2, and the third contact 17 is formed to penetrate the second interlayer insulating layer 19 and the first interlayer insulating layer 14 and reach the source or drain layer 12. Then, the wire group 18 including the wire 18a and the wire 18b connected to the second contact 16 and the third contact 17, respectively, is formed on the upper surface of the first interlayer insulating layer 14.

Figure 10:
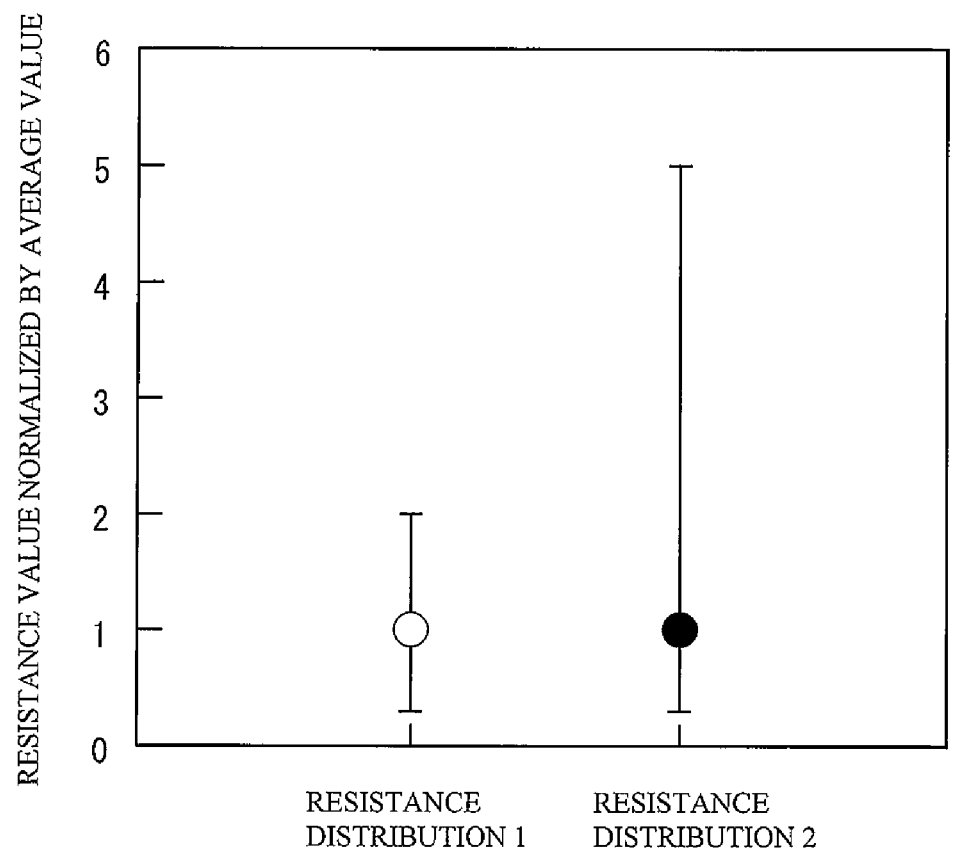
FIG. 10 is a view showing a distribution of resistance values of the resistance variable layer in the nonvolatile memory device according to an example of the present invention, in comparison with a distribution of resistance values in a resistance variable layer in a comparative example.

FIG. 10 is a view showing a distribution of initial resistances of the resistance variable layer 3 in the nonvolatile memory device 10B of Embodiment 2 manufactured in the above manufacturing method, in comparison with a distribution of resistance values in the resistance variable layer in the comparative example.

In FIG. 10, a horizontal axis indicates the example of the present invention, and the comparative example such that they are distinguishable from each other, while a vertical axis indicates the resistance values normalized by average values. Resistance value distribution 1 indicates a distribution of the resistance values of the resistance variable layer 3 in the example of the present invention, while resistance value distribution 2 indicates a distribution of the resistance values of the resistance variable layer 3 in the comparative example.

The nonvolatile memory device of the present example was manufactured by the manufacturing method of the example of the present invention. The nonvolatile memory device of the comparative example was manufactured by a manufacturing method identical to the manufacturing method of the present example, except that a conductive hard mask comprising TiAlN was used instead of the charge diffusion prevention mask 1B. The resistance values of these nonvolatile memory devices were measured and their distributions were derived.

As can be seen from FIG. 10, a variation in the resistance values in the resistance value distribution (resistance value distribution 1) of the example of the present invention is lesser than a variation in the resistance values in the resistance value distribution (resistance value distribution 2) of the comparative example. Thus, it has been proved that the manufacturing method of the nonvolatile memory device of the embodiment of the present invention can reduce the charging damage to the resistance variable layer 3 due to the etching plasma charge, and charging damage to the resistance variable layer 3 due to the etching plasma charge can be reduced in the nonvolatile memory device of the embodiment of the present invention.

Although in Embodiment 1 and Embodiment 2, the nonvolatile memory device including one transistor/one nonvolatile memory element has been described, for example, the present invention may be applied to a nonvolatile memory device including one diode (or non-linear element)/one nonvolatile memory element.

In Embodiment 2, the conductive metal mask layer 23 of the charge diffusion prevention mask 1B may be left on the upper electrode layer 2 finally.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

INDUSTRIAL APPLICABILITY

A nonvolatile memory device of the present invention is useful in the uses of various electronic devices such as digital home appliances, memory cards, cellular phones, and personal computers.

A manufacturing method of a nonvolatile memory device of the present invention is useful in a manufacturing method of the nonvolatile memory device which can be incorporated

REFERENCE SIGNS LISTS 1A, 1B charge diffusion prevention mask
1A' charge diffusion prevention film
2 upper electrode layer
2' upper electrode film
3 resistance variable layer
3' resistance variable film
4 lower electrode layer
4' lower electrode film
10A, 10B nonvolatile memory device
11 substrate
12 source/drain layer
13 gate layer
14 first interlayer insulating layer
15 first contact
16 second contact
17 third contact
18 wire group
18a, 18b wires
19 second interlayer insulating layer
21 inorganic insulating mask layer
21' inorganic insulating mask film
23 conductive metal mask layer (hard mask)
23' conductive metal mask film
24 resist mask
101 nonvolatile memory element
102 thin-film transistor

The invention claimed is:

1. A method of manufacturing a nonvolatile memory device including an upper electrode layer, a lower electrode layer and a resistance variable layer sandwiched between the upper electrode layer and the lower electrode layer, the method comprising steps of:
 depositing a lower electrode film on a substrate;
 depositing a resistance variable film on the lower electrode film;
 depositing an upper electrode film on the resistance variable film;
 depositing a charge diffusion prevention mask film on the upper electrode film;
 patterning the charge diffusion prevention mask film in a predetermined shape to form a charge diffusion prevention mask comprising the charge diffusion prevention mask film; and
 dry etching the upper electrode film, the resistance variable film, and the lower electrode film, using the charge diffusion prevention mask as a mask, to form the upper electrode layer, the lower electrode layer and the resistance variable layer, wherein:
 the resistance variable film includes a first film comprising oxygen-deficient transition metal oxide and a second film comprising oxygen-deficient transition metal oxide which is higher in oxygen content than the first film such that the first film and the second film are stacked together, the resistance variable film changing a resistance value due to a change in the oxygen content, and oxygen and holes in the resistance variable film migrating due to etching plasma charge,
 at least one of the upper electrode film and the lower electrode film comprises a simple substance or alloy of a platinum group element, and
 the charge diffusion prevention mask film is insulative, and is lower in etching rate of the dry etching than the upper electrode film and the lower electrode film.

2. The method of manufacturing the nonvolatile memory device according to claim 1, wherein:
 the charge diffusion prevention mask film includes an inorganic insulating film comprising an inorganic insulating material, and a conductive metal film formed on the inorganic insulating film and comprising a metal, and
 the step of depositing the charge diffusion prevention mask film includes depositing the inorganic insulating film on the upper electrode film; and depositing the conductive metal film on the inorganic insulating film.

3. The method of manufacturing the nonvolatile memory device according to claim 2, wherein the inorganic insulating material of the inorganic insulating film comprises one material selected from $Ta_2O_5$, SiN, and SiON, or a combination of two or more materials selected from $Ta_2O_5$, SiN, and SiON.

4. The method of manufacturing the nonvolatile memory device according to claim 2, further comprising steps of:
 after forming the upper electrode layer, the lower electrode layer and the resistance variable layer,
 removing a layer comprising the conductive metal film from the charge diffusion prevention mask; and
 forming an interlayer insulating layer over the substrate such that the interlayer insulating layer covers a charge diffusion prevention layer from which the layer comprising the conductive metal film has been removed, the upper electrode layer, the lower electrode layer and the resistance variable layer.

5. The method of manufacturing the nonvolatile memory device according to claim 1, wherein:
 the charge diffusion prevention mask film includes a single film which is lower in etching rate of the dry etching than the upper electrode film and the lower electrode film, and
 the step of depositing the charge diffusion prevention mask film is depositing the single film on the upper electrode film.

6. The method of manufacturing the nonvolatile memory device according to claim 5, wherein the single film comprises $Ta_2O_5$.

7. The method of manufacturing the nonvolatile memory device according to claim 5, further comprising a step of:
 after forming the upper electrode layer, the lower electrode layer and the resistance variable layer,
 forming an interlayer insulating layer over the substrate such that the interlayer insulating layer covers a charge diffusion prevention layer comprising the single film, the upper electrode layer, the lower electrode layer and the resistance variable layer.

8. The method of manufacturing the nonvolatile memory device according to claim 1, wherein the platinum group element is platinum, iridium, or palladium.

9. The method of manufacturing the nonvolatile memory device according to claim 1, wherein the charge diffusion prevention mask film and the resistance variable film comprise an identical element.

10. The method of manufacturing the nonvolatile memory device according to claim 1, further comprising a step of:
 forming a contact which penetrates the charge diffusion prevention mask and reaches the upper electrode layer.

11. The method of manufacturing the nonvolatile memory device according to claim 1, further comprising a step of:
 removing the charge diffusion prevention mask.

12. A nonvolatile memory device comprising:

an upper electrode layer;

a lower electrode layer;

a resistance variable layer sandwiched between the upper electrode layer and the lower electrode layer; and a charge diffusion prevention mask formed on and covering only a portion of a top surface of the upper electrode layer, wherein:

the resistance variable layer includes a first layer comprising oxygen-deficient transition metal oxide and a second layer comprising oxygen-deficient transition metal oxide which is higher in oxygen content than the first layer such that the first layer and the second layer are stacked together, the resistance variable film changing a resistance value due to a change in the oxygen content, and oxygen and holes in the resistance variable film migrating due to etching plasma charge, at least one of the upper electrode layer and the lower electrode layer comprises a simple substance or alloy of a platinum group element, and the charge diffusion prevention mask is insulative, and is lower in etching rate of dry etching than the upper electrode layer and the lower electrode layer.

13. The nonvolatile memory device according to claim 12, wherein the charge diffusion prevention mask comprises one material selected from $Ta_2O_5$, SiN, and SiON, or a combination of two or more materials selected from $Ta_2O_5$, SiN, and SiON.

14. The nonvolatile memory device according to claim 12, wherein the charge diffusion prevention mask comprises $Ta_2O_5$.

15. The nonvolatile memory device according to claim 12, wherein the platinum group element is platinum, iridium, or palladium.

16. The nonvolatile memory device according to claim 12, wherein the charge diffusion prevention mask and the resistance variable layer comprise an identical element.

17. The nonvolatile memory device according to claim 12, further comprising a contact which penetrates the charge diffusion prevention mask and reaches the upper electrode layer.

* * * * *